United States Patent
Pocholle et al.

[11] Patent Number: 5,912,455
[45] Date of Patent: Jun. 15, 1999

[54] PHOTOCONDUCTOR-BASED ELECTRICAL SWITCH

[75] Inventors: Jean-Paul Pocholle, La Norville; Daniel Kaplan; Thibaut de Saxce, both of Paris; Franck Lacassie, Pau, all of France

[73] Assignee: Thomson-CSF, Paris, France

[21] Appl. No.: 08/852,686

[22] Filed: May 7, 1997

[30] Foreign Application Priority Data

Jun. 7, 1996 [FR] France ................................. 96 07079

[51] Int. Cl.⁶ .................................................. H01J 40/14
[52] U.S. Cl. ................................. 250/214 R; 250/214.1
[58] Field of Search ......................... 250/214 R, 214.1, 250/214 A; 257/431, 432, 451

[56] References Cited

U.S. PATENT DOCUMENTS

| | | |
|---|---|---|
| 3,620,597 | 11/1971 | Schwartz .................................. 359/243 |
| 3,801,825 | 4/1974 | Schwartz et al. . |
| 4,693,599 | 9/1987 | Margulis et al. ........................ 356/121 |
| 4,917,450 | 4/1990 | Pocholle et al. . |
| 4,927,245 | 5/1990 | Papuchon et al. . |
| 4,943,144 | 7/1990 | Delacourt et al. . |
| 5,077,466 | 12/1991 | Delacourt et al. . |
| 5,168,164 | 12/1992 | Urakami et al. ...................... 250/458.1 |
| 5,247,168 | 9/1993 | Pocholle et al. . |
| 5,258,612 | 11/1993 | Clark et al. .............................. 250/226 |
| 5,289,309 | 2/1994 | Delacourt et al. . |
| 5,325,324 | 6/1994 | Rentzepis et al. ....................... 365/127 |
| 5,332,918 | 7/1994 | Smith et al. . |
| 5,570,387 | 10/1996 | Carriere et al. . |
| 5,757,992 | 5/1998 | Miller ....................................... 385/24 |

FOREIGN PATENT DOCUMENTS

| | | |
|---|---|---|
| 1 466 676 | 3/1977 | United Kingdom . |
| 2 131 227 | 6/1984 | United Kingdom . |

*Primary Examiner*—Que T. Le
*Assistant Examiner*—John R. Lee
*Attorney, Agent, or Firm*—Oblon, Spivak, McClelland, Maier & Neustadt, P.C.

[57] ABSTRACT

A photoconductor-based electrical switch comprises an element made of photoconductor material possessing two electrodes located. on either side of an active zone, at least one light source emitting at least one light beam illuminating the active zone, the beam having a wavelength corresponding to a level of photon energy lower than the bandgap energy of the photoconductor material, the intensity of the light beam being such that there is a combination of the energy of at least two photons in the photoconductor material, in such a way that a mechanism of two-photon absorption in the photoconductor material contributes to the creation of carriers enabling the photoconductor material to be made conductive.

11 Claims, 3 Drawing Sheets

PHOTOCONDUCTOR-BASED ELECTRICAL SWITCH

BACKGROUND OF THE INVENTION

The invention relates to a photoconductor-based electrical switch.

Photoconductor-based electrical switching consists of the connection of two circuit elements by a semiconductor material that is highly insulating in darkness and in setting up a connection by subjecting this solid to a light flux that makes it conductive. The conduction thus results from the photo-creation of electrically charged carriers (electrons and holes).

Photoconductor-based electrical switching has a number of advantages as compared with other modes of control (such as mechanical modes, electrical arcs and discharge in gases, etc.).

These advantages are:

the galvanic insulation of the actuator, a very short intrinsic response time that corresponds to the laser pulse used, the absence of fluctuations at the instant at which the current is set up, determined by the appearance of light.

The optical control source is represented by a laser. At present, ultra-short optical pulses (of some $10^{-15}$s) are obtained from such sources. This makes it possible to obtain electrical pulses with very sudden transitions.

In the case of high-power electrical pulses (for example in the range of 1 MW), the photoconductor is subjected to high currents (kA). It is then desirable to have a wide-sectioned photoconductor (for example of some mm$^2$). Furthermore, the selection switching of high voltages (kV) implies the use of switch structures of sufficient length (some mm) in order to avoid reaching the zone of rupture of the material. All the sizes are in the range of 1 mm (or more) and it is desired to create charge carriers in the entire volume.

The optical absorption of semiconductor materials at a given wavelength is generally either very low (the energy of the photon is below that of the bandgap energy of the material) or very high (with an absorption coefficient of several hundreds of cm$^{-1}$ once the energy of the photon is greater than that associated with the bandgap). The search for intermediate values of the absorption coefficient requires a relatively precise matching between the excitation wavelength (laser) and the threshold wavelength of the semiconductor (associated with the bandgap energy). This matching is generally not obtained.

Furthermore, since the absorption is very high, it is done generally on the surface of the material. The thickness of ionized material is then very small. The section of the material perpendicular to the switch-over direction and therefore perpendicular to the flow of a current to be switched over is very small. If the current to be switched over has very high intensity, there is a risk that the material might be damaged in the absorption zone owing to the heating caused by the passage of the current.

Certain semiconductors such as silicon have absorption coefficients that are lower at the wavelengths below the absorption threshold (as compared with GaAs). These semiconductors constitute a limitation on high-power switch-over operations. Furthermore, the characteristics of the carriers in these semiconductors do not favor the obtaining of efficient switching (low mobility of carriers).

SUMMARY OF THE INVENTION

An object of the invention therefore is an photoconductor-based electrical switch enabling the switch-over of high currents.

It relates to a photoconductor-based electrical switch comprising an element made of photoconductive material possessing two electrodes located on either side of an active zone, at least one light source emitting at least one light beam illuminating the active zone, the beam having a wavelength corresponding to a level of photon energy lower than the bandgap energy of the photoconductor material, the intensity of the light beam being such that the energy of at least two photons is combined in the photoconductor material.

BRIEF DESCRIPTION OF THE DRAWINGS

The various objects and characteristics of the invention shall appear more clearly from the following description and the appended figures, of which.

MORE DETAILED DESCRIPTION

Figure 1:
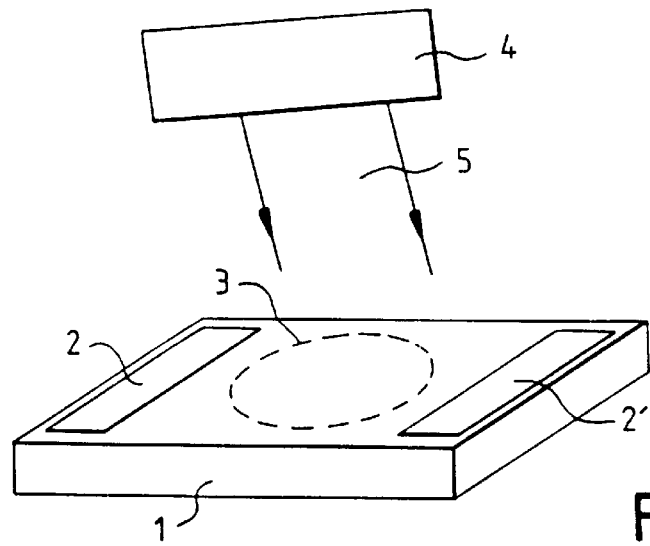
FIG. 1 shows an exemplary simplified embodiment of the device of the invention.

Referring to FIG. 1, a description shall be given first of all of an exemplary simplified embodiment of the switch according to the invention.

An element made of photoconductor material 1 has, at two opposite ends, two electrodes 2, 2'. Between these two electrodes, a zone 3 is illuminated by a beam 5 put out by a source 4. For example, the wavelength of the beam 5 is such that its photon energy is smaller than or equal to the bandgap energy of the photoconductor material 1. Furthermore, the optical intensity of the beam is such that it gives rise to a two-photon absorption phenomenon or else, expressed in other terms, such that the sum of the energy values of two photons corresponds to the bandgap energy of the photoconductor material.

The effective distance over which the carriers are generated is of the millimetrical type. This makes it possible to obtain a volume plasma rather than a surface plasma. According to the invention, the two-photon absorption phenomenon (A2P) is used for this purpose.

The two-photon absorption mechanism expresses the excitation of a semiconductor material in the domain of transparency of this material. The effect of the wavelength is shown schematically in FIGS. 2a and 2b.

This non-linear phenomenon appears for a high density of light excitation. Its operation relies on the existence of a virtual level with a short lifetime. This mechanism is all the more efficient as the optical control intensity is applied to the semiconductor material in short-pulse operating mode.

Let us consider the material GaAs which displays a level of bandgap energy in the region of 1.424 eV. A photon coming from an Nd:YAG laser (or any other matrix) has an energy value of 1.165 eV and the two-photon absorption corresponds to 233 eV (FIG. 2a).

Figures 2A, 2B:
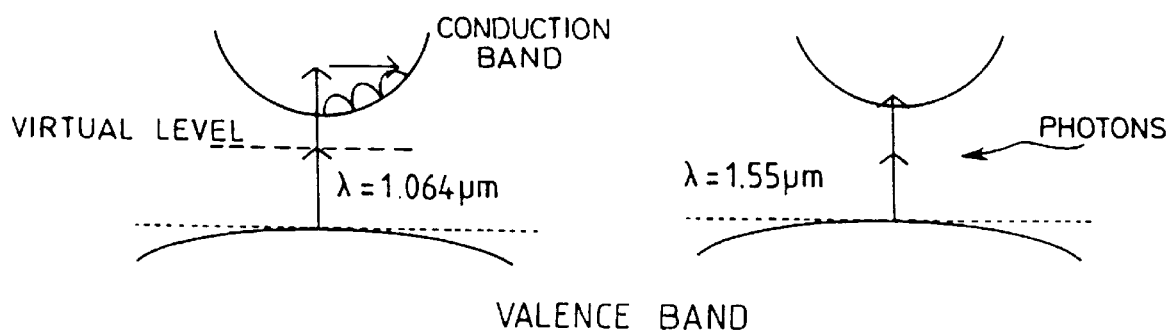
FIGS. 2a, 2b are explanatory diagrams of the working of the device of the invention.

The use of a source working towards 1.55 $\mu$m (energy of the photon=0.8 eV) makes it possible to attain 1.6 ev according to the non-linear absorption process (FIG. 2b). This source may be represented by a doped glass laser Er$^{3+}$or by a laser fiber (with fiber amplifier).

By overlooking absorption by the carriers, the development of optical intensity in the medium follows the relationship:

$$\frac{dI(r, z, t)}{dz} = -\alpha |(r, z, t) - |(r, z, t)^2$$

where α represents the linear absorption coefficient in intensity and β is the two-photon absorption coefficient. This equation has the following solution:

$$I(z) = \frac{I_o \alpha e^{-\alpha z}}{\alpha + \beta I_o (1 - e^{-\alpha Z})}$$

$I_o$ is the optical intensity coupled to the semiconductor material $$I_o = \frac{E_o}{\pi^{3/2} \tau_L w_0^2}$$

$E_o$ is the energy contained in the laser pulse $\tau_L$, $W_o$ representing respectively the width of the pulse and the dimension of the ray of the laser beam at 1/e (in the case of a Gaussian distribution).

For example, let us consider the high purity non-doped massive GaAs semiconductor material. The absorption coefficient at the wavelength λ=1.06 μm typically ranges from α=0.6 cm$^{-1}$ to 1.2 cm$^{-1}$. The two-photon absorption coefficient obtained experimentally $\beta_{exp}$ is in the range of 20 cm/GW.

This mode of operation thus described may be obtained by means of a variety of semiconductor materials and alloys that can be used to implement this architecture over a wide spectral domain. The excited volume is defined by:

the effective section of the laser beam, the reverse of the absorption coefficient (cm$^{-1}$).

Figure 3:
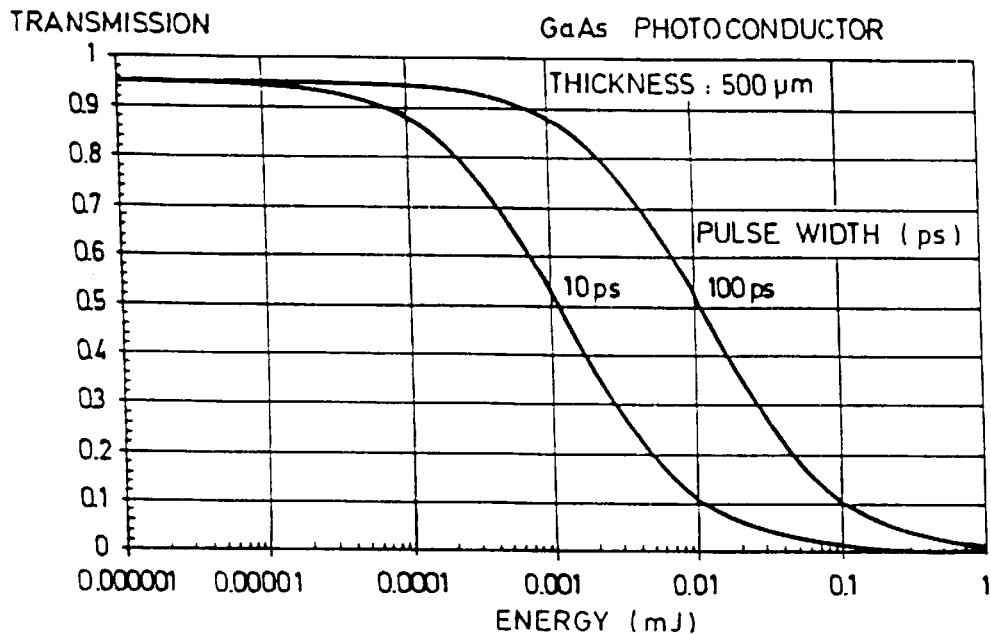
FIGS. 3, 4, 5 are curves of operation of the device of the invention.

Let us consider the light transmission of a wafer of gallium arsenide with a thickness of 500 μm. Taking account of the two-photon absorption, the development of the transmission is computed as a function of the energy contained in the control light pulse. At the wavelength 1.064 μm, as a function of the pulse width, the curves of transmission shown in FIG. 3 are obtained. The focusing radius is 50 μm and the coefficient of residual linear loss is 1 cm$^{-1}$. It is observed that 90% of the energy is absorbed according to the two-photon absorption process for a laser energy level of 10 μJ contained in a pulse with a duration of 10 ps interacting with the semiconductor compound. This efficiency shows that the two-photon absorption mechanism can be used for the generation, within the photoconductor, of electron-hole pairs that contribute to making a volume conduction plasma. However, to obtain the absorption rate of 90% with a pulse duration of 100 ps, it is necessary to have an energy value of 100 μJ.

Another way of representing the effect consists in assessing the transmission as a function of the depth of penetration of the optical wave in the semiconductor material (GaAs for example). For this purpose, two different examples of excitation are considered.

Case 1: Nd:YAG laser source

Energy per pulse coupled with the semiconductor material: 1 mJ.

Pulse duration: 1 ns.

Focusing dimension: 250 μm. corresponding to an intensity of: 0.287 GW/cm$^2$ (flux density=0.287 J/cm$^2$).

Case 2: sub-nanosecond Nd:YAG laser source

Energy per pulse coupled with the semiconductor material: 10 μJ.

Pulse duration: 100 ns.

Focusing dimension: 100 μm.

Intensity: 0.179 GW/cm$^2$ (fluence=17.95 mJ/cm$^2$).

Case 3: picosecond Nd:YAG laser source

Energy per pulse coupled with the semiconductor material: 10 μJ.

Pulse duration: 10 ps.

Focusing dimension: 100 μm.

Intensity: 1.796 GW/cm$^2$ (fluence=17.95 mJ/cm$^2$).

Case 4: picosecond Nd:YAG laser source

Energy per pulse coupled with the semiconductor material: 10 μJ.

Pulse duration: 10 ps.

Focusing dimension: 250 μm.

Intensity: 0.287 GW/cm$^2$ (flux density=2.87 mJ/cm$^2$).

Figure 4:
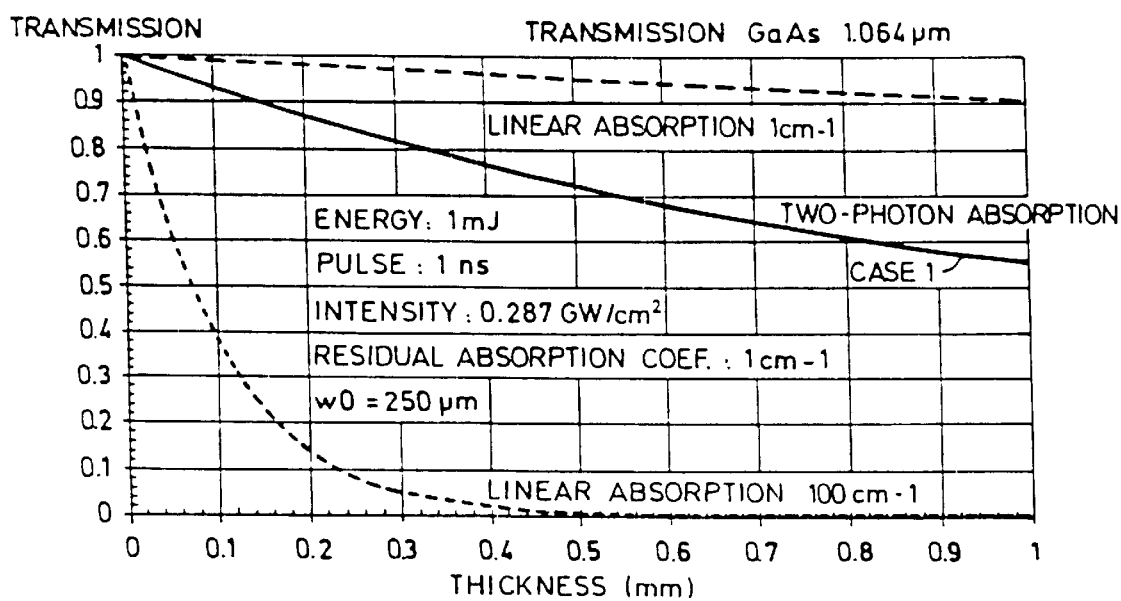
Figure 5:
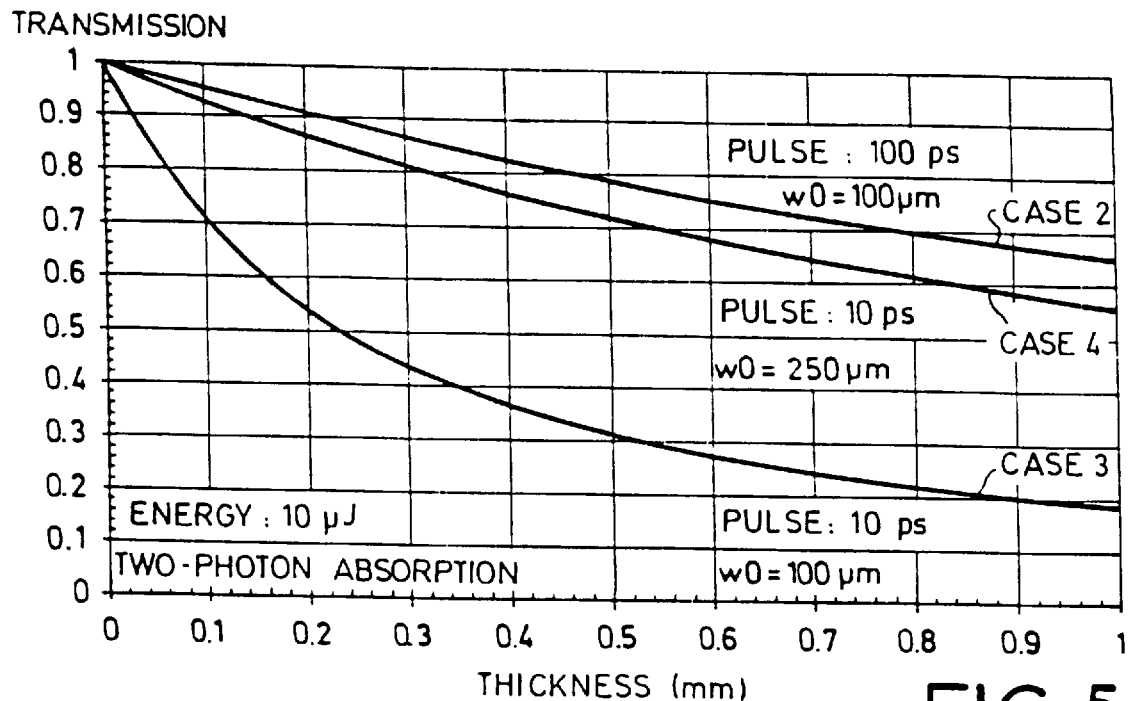

FIGS. 4 and 5 make it possible to observe the progress of transmission as a function of the depth of penetration of the laser pulse in the photoconductor material. FIG. 4 corresponds to the Case 1. FIG. 5 represents Cases 2, 3 and 4. The associated absorption values describe the creation of carriers and consequently the seeding in volume of carriers by means of a laser beam whose wavelength is located in the field of transparency of the semiconductor material. As can be seen, the transmission diminishes and hence the two-photon absorption increases when the energy of the light pulse increases (case 1). But above all, it can be seen that for a given level of light energy (cases 1, 2 and 3), the absorption is greater with a brief pulse and a greater density of energy per unit of surface area (case 3).

The advantages of the device of the invention are:

minimizing the thermal effects in terms of surface and volume ==> reduction of mechanical constraints: this factor has an effect on mechanical behavior and the deterioration of the interface, the excited volume is greater, leading to a reduction of the effects of filamentation, the Auger effect, an increase of the current that can be switched over and a reduction of the weight of the interface effects (recombination centers), it is not necessary to adjust the optical excitation wavelength with the wavelength associated with the absorption window (band border) of the semiconductor, it is possible to adjust the volume distribution of the carriers by playing on the focusing within the semiconductor material.

The levels of energy (and the intensities) required to implement this mechanism with the photoconductors are now accessible from miniature sources delivering ultra-short laser pulses. It is furthermore possible to adjust the absorption coefficient by playing on the focusing of the optical beam or the duration of the laser pulse.

The duration of the pulse will be in the sub-picosecond to sub-nanosecond range. For example, it will range from some femto-seconds or tens of femto-seconds to some hundreds of picoseconds.

By way of an indication, the use of a laser working at 1.06 μm delivering 10 μJ in a 1 ps pulse can give an equivalent absorption coefficient of 10 cm$^{-1}$ for an illumination spot of about 1 mm$^2$. The illumination can be done either directly in the inter-electrode spacing or by the rear face. The limitation in this case is represented by the width of the pulse which takes up a distance of about 100 μm for a period of illumination of 1 ps in GaAs.

By contrast, as regards the threshold of optical damage, it ca be seen that the critical flux density (J/cm$^2$) varies according to a relationship in $\Delta\tau^{1/2}$ for pulse durations in the region of 100 ps and more but varies as $\Delta\tau^{-1}$ for ps or sub-picosecond pulses. The comparison of the cases 2 and 4 shows the value of working with short pulses in terms of fluence for a two-photon absorption effect.

Figure 6:
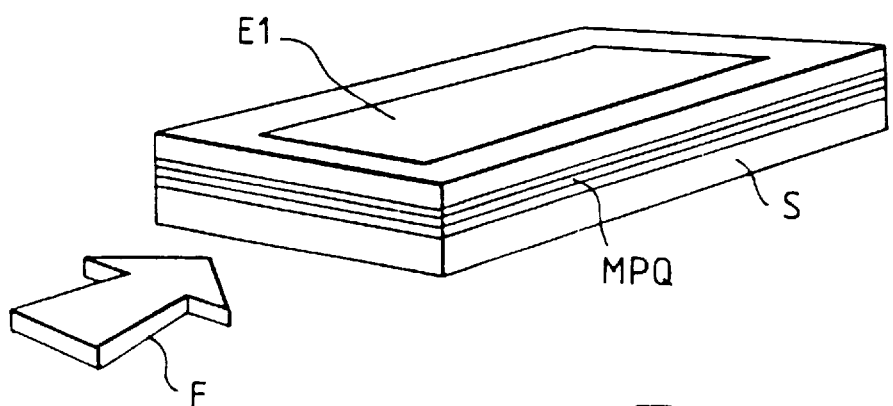
FIG. 6 shows a more detailed exemplary embodiment of a switc h according to the invention.

This mechanism has been described in considering conventional structures of solid splitters. It is also possible to envisage the use of this reaction in considering a configuration that is identified with a transversal multimode guide. This configuration is shown schematically in FIG. 6. The layer or layers of photoconductor material are gripped between two electrodes or a substrate S and an electrode E1. The beam F is incident to the device along the plane of the layer or layers of photoconductor material.

The properties of such a structure are shown by:
- the possibility of the use of lift-off techniques permitting a deposit of active material on a thermally adapted substrate: silicon or sapphire (transparent at 1.06 μm),
- the command depends on the polarization of the exciting beam (selection rule: electromagnetic wave coupling at the heavy electron-hole and light electronhole transitions),
- the optical confinement favors the use of two-photon absorption,
- the interaction length may be great and the use of flared structures in the guide is used to distribute the density of photon-induced carriers,
- finally, this geometry permits the stacking of single optical command multiple switches.

What is claimed is:

1. A photoconductor-based electrical switch comprising an element made of photoconductive material possessing two electrodes located on either side of an active zone, at least one light source emitting at least one light beam illuminating the active zone, the beam having a wavelength corresponding to a level of photon energy lower than the bandgap energy of the photoconductive material, the intensity of the light beam being such that there is a combination of the energy of at least two photons in the photoconductive material, in such a way that a mechanism of two-photon absorption in the photoconductive material contributes to the creation of carriers enabling the photoconductive material to be made conductive.

2. A switch according to claim 1, wherein the beam has a wavelength for which the value of the photon energy ranges between half the bandgap energy of the photoconductive material and the bandgap energy of the material.

3. A switch according to claim 1, wherein the intensity of the light beam has a value enabling two-photon absorption in the photoconductive material.

4. A switch according to claim 3, wherein the light beam is transmitted in the form of light pulses whose duration is in the sub-picosecond to sub-nanosecond range.

5. A switch according to claim 1, wherein focusing of the light beam on the photoconductive material is controllable.

6. A switch according to claim 1, wherein the source is a neodymium-doped laser enabling an emission of a light beam at a wavelength of 1.064 or 1.32 μm.

7. A switch according to claim 1, wherein the photoconductive material is GaAs.

8. A switch according to claim 1, wherein the element made of photoconductive material is plane-shaped and wherein the active zone illuminated by the light beam is located on a main face of the element.

9. A switch according to claim 8, wherein the element made of photoconductive material is plane-shaped and wherein it is illuminated by illuminated at one edge by the light beam.

10. A switch according to claim 1, wherein the photoconductive material is made of GaAs and the laser source is a neodymium-doped YAG laser.

11. A switch according to claim 1, wherein the duration of a light pulse of said beam 10 ps or less and wherein the incident optical flux density is greater than 1.5 mJ/cm$^2$.

* * * * *